United States Patent [19]

Graham et al.

[11] Patent Number: 5,139,876
[45] Date of Patent: Aug. 18, 1992

[54] CERAMIC ARTICLE HAVING WEAR RESISTANT COATING

[75] Inventors: Edgar E. Graham, Lyndhurst, Ohio; James F. Makki, Oswego, N.Y.

[73] Assignee: Cleveland State University, Cleveland, Ohio

[21] Appl. No.: 488,984

[22] Filed: Mar. 5, 1990

[51] Int. Cl.$^5$ .............................................. B32B 33/00
[52] U.S. Cl. ................................. 428/411.1; 428/420; 428/698; 428/704
[58] Field of Search ................. 428/704, 698, 695, 64, 428/, 432, 433, 411.1, 420; 427/255.6

[56] References Cited

U.S. PATENT DOCUMENTS

| | | | |
|---|---|---|---|
| 3,915,757 | 10/1975 | Engel | 148/278 |
| 4,020,236 | 4/1977 | Aonuma | 428/694 |
| 4,323,629 | 4/1982 | Kunieda | 428/457 |
| 4,418,126 | 11/1983 | Izumi | 428/692 |
| 4,465,337 | 8/1984 | Baron et al. | 350/164 |
| 4,532,149 | 7/1985 | McHargue | 427/38 |
| 4,536,444 | 8/1985 | Sumiya | 428/695 |
| 4,582,746 | 4/1986 | Shirahata | 428/695 |
| 4,613,548 | 9/1986 | Lum | 428/900 |
| 4,761,334 | 8/1988 | Sagoi et al. | 428/695 |
| 4,871,625 | 10/1989 | Dekura | 428/695 |

FOREIGN PATENT DOCUMENTS 251916  10/1988  Japan .................................. 428/695

Primary Examiner—Ellis P. Robinson
Assistant Examiner—Archene A. Turner
Attorney, Agent, or Firm—John F. McDevitt

[57] ABSTRACT

Means are disclosed to provide a ceramic article with a protective coating which resists mechanical wear at elevated temperatures up to 500° C. and higher. The coating is applied by first chemically depositing activating metal ions on the uncoated ceramic surface and thereafter vapor depositing an adherent organic polymer lubrication film on the activated surface. Ceramic materials provided with such protective coating include silicon carbide, silicon nitride and vitreous silica.

13 Claims, 3 Drawing Sheets

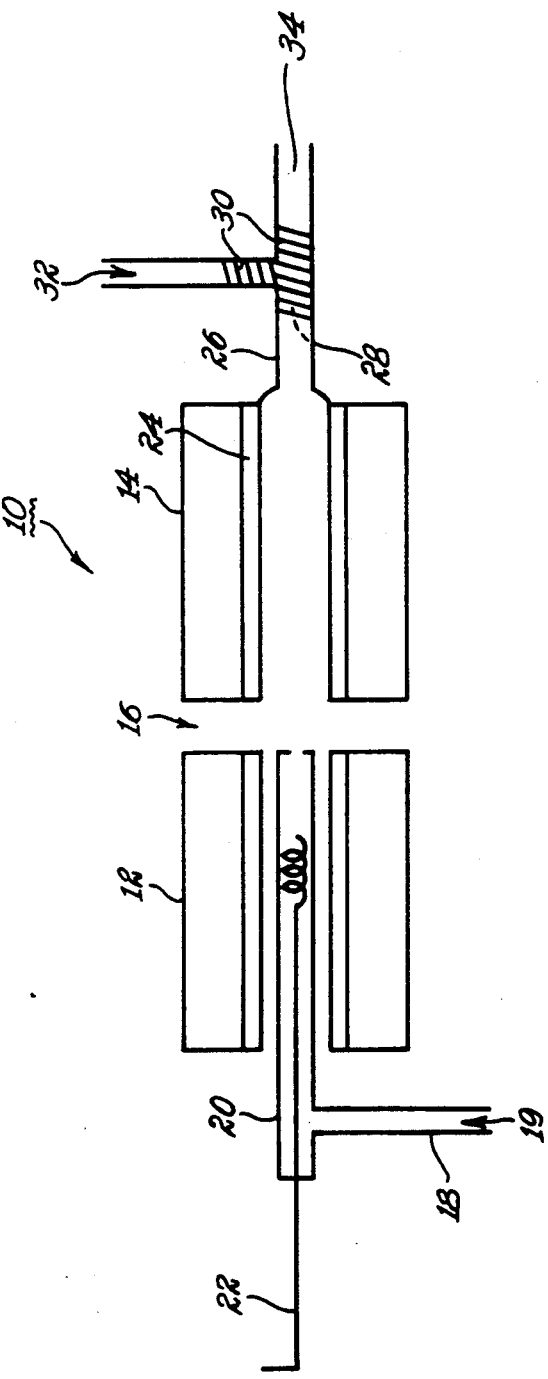

CERAMIC ARTICLE HAVING WEAR RESISTANT COATING

BACKGROUND OF THE INVENTION

This invention relates generally to means enabling a ceramic article to be provided with an adherent organic polymer lubricating film which resists mechanical wear of the coated article at elevated temperatures up to 500° C. and higher, and more particularly, to affording such protection to a variety of ceramic materials including both crystalline and vitreous ceramics.

Lubrication is a well recognized means to reduce friction and wear between surfaces in dynamic contact. Two major areas for which improved lubricants are needed for continued progress are metal forming and transportation. Better metal forming capabilities to minimize machining and grinding require lubrication techniques and lubricants that can be used effectively at temperatures approaching the melting points of the metals now employed. In transporation, one of the most productive areas for increasing energy efficiencies is often referred to as the "adiabatic" engine wherein temperatures range from 500° C. and 1100° C. making the selection of lubricants and the means of lubrication still difficult. A know technique for lubricating at such high temperatures is the use of solid lubricants in the form of plasma sprayed coatings of the metals and ceramics being employed. More recent developments whereby an adherent solid polymeric lubricating film is deposited on a ferrous metal surface to afford such protection are reported in technical publications entitled "In Situ Formation of Solid Lubricating Film from Conventional Mineral Oil and Ester Solid Lubricants", authored by N. deGouvea Pinto, J. L. Duda, E. E. Graham and E. E. Klaus, ASLE Proceedings, 3rd International Conference on Solid Lubrication, ASLE SP-14 1984 and "Lubrication from the Vapor Phase at High Temperatures", authored by E. E. Graham and E. E. Klaus, ASLE transactions volume 29, no. 2, pages 229-334 (1986). As described in said technical publications, the metal surfaces are deemed to have a catalytic effect upon the vapor phase reactants whereby surface polymerization of said reactants takes place to produce the protective film. Possibly the absence of comparable metal catalytic agents in ceramic materials has prevented the formation of the protective film in such manner. More particularly, a vapor phase deposition of the same reactants under the same process conditions has thus far only produced non-adherent surface deposits affording no substantial protection to the underlying ceramic substrate.

Silicon carbide and silicon nitride ceramics are now being studied extensively for high temperature engineering applications as above indicated, to include advanced heat engines and gas turbines. Both ceramics are crystalline materials with silicon carbide being a very hard material which is both corrosion and thermal resistant, is lighter than steel and exhibits a high thermal conductivity and low thermal expansion whereas silicon nitride is characterized by low thermal expansion, excellent corrosion resistance and high temperature stability. On the other hand, both of said ceramic materials undergo significant mechanical abrasion when subjected to the dynamic wear conditions being experienced with such product applications. Vitreous silica or fused quartz represents still a different type ceramic material experiencing aggravated physical wear if subjected to dynamic conditions at elevated temperatures. Accordingly, it remains desirable to produce an effective means enabling various products formed with either crystalline or vitreous ceramic materials to be provided with a protective coating resistant to dynamic wear conditions such as abrasion and adhesive wear up to elevated temperatures of at least 500° C.

It is one object of the present invention, therefore, to provide effective means whereby an adherent lubricating film can be deposited on various ceramic substrates affording resistance to mechanical wear of the coated article at elevated temperatures up to at least 500° C.

It is another object of the invention to provide novel surface treatment means enabling a treated ceramic surface to be thereafter provided with an adherent wear resistant coating.

Still another object of the present invention is to provide a novel method for surface treatment of the ceramic article so as to enable subsequent deposition of a wear resistant protective coating on the treated ceramic surface.

A still further object of the present invention is to provide a novel method enabling a wear resistant protective coating to be formed on a ceramic article.

These and still further objects of the present invention will become apparent upon considering the following detailed description of the present invention.

SUMMARY OF THE INVENTION

Novel means have now been discovered to modify the surface of a ceramic article for deposition of an adherent solid organic polymer film thereon which resists mechanical wear of the ceramic article at elevated temperatures. More particularly, activating metal ions are deposited in a particular manner upon the ceramic surfaces for improved formation and adherence thereto of a vapor deposited solid organic polymer lubricating film which resists mechanical wear of the ceramic article at elevated temperatures up to at least 500° C. In one embodiment, the activating metal ions form a film deposit on the treated surface with the activating metal ions comprising a transition metal element selected from the Periodic Table of Elements, to include iron and tin. The general method employed to activate the ceramic surface in such manner comprises chemically treating the uncoated surface at elevated temperatures with a source of the activating metal ions such as a metal compound, and which can be carried out in various ways. For example, the uncoated ceramic article can be heated to temperatures of at least 300° C. for exposure thereat to a vaporized source of the activating metal ion and which can include further conditioning of the activated ceramic surface by subsequent exposure to ambient atmospheric conditions. Alternately, the uncoated ceramic surface can be activated by heating to the aforementioned elevated temperatures and subjected thereafter to a liquid dispersion of the activating metal ion, such as by immersion or spraying to include electrostatic spraying. A continuous film of the activating metal ions is chemically deposited in the foregoing manner on various ceramic substrates which can then optionally be further conditioned to promote coating adherence by exposure to the atmosphere for time periods ranging from a few minutes to hours in duration.

Formation of a tenacious lubricating film on the chemically treated surface is achieved with vapor deposition at elevated temperatures of various polymer forming organic reactants. While the influence of the activating metal ions on polymer surface film formation has not been fully investigated at the present time, it is believed attributable at least in part to a formation of further reactive organic moieties in the gas phase of the particular reaction medium herein being employed. Suitable organic reactant materials to produce the wear resistant solid polymer coating of the present invention can be selected from the general class of petroleum and synthetic lubricants which exhibit substantial vapor pressure at the 300°-800° C. range herein employed for vapor deposition and can be further generally characterized by relative chemical inertness and thermal stability at lower temperatures. Accordingly, petroleum hydrocarbon compounds such as dodecane and mineral oils can be used as well as aromatic type compounds. Suitable synthetic lubricants include polybutenes, diesters, polyglycols, chlorinated hydrocarbons, phosphate esters, silicate esters and the like. A preferred class of esters include monobasic acid esters such as neopentylpoyolester, dibasic acid esters such as di-2-ethylhexyl sebacate and phosphate esters to include tricresyl phosphate (TCP) and tripenyl phosphate.

In one representative embodiment, a satisfactory friction resistant polymer coating has been applied to one or more surfaces of a silicon carbide or silicon nitride block sample by a method wherein (a) the uncoated block sample is initially preheated in air to approximately 300° C. or higher, (b) the preheated sample is next immersed in a liquid dispersion of the activating metal ion maintained at ambient temperature to form a continuous surface film of the activating metal ion on the treated sample, (c) the treated sample then allowed to dry at ambient temperature for time periods ranging from a few minutes to twenty-four hours whereupon conditioning of said said surface film is found to promote adherence of the subsequently applied polymer coating, and (d) the conditioned sample next placed in a suitable apparatus for deposition of the final coating on the now metal ion activated ceramic surface with a vaporized polymer-forming organic reactant at temperatures in the range from approximately 300° C. up to approximately 800° C. under slightly oxidizing atmospheric conditions. Various metal ion liquid dispersions employed to form a continuous film on the ceramic sample prior to vapor deposition of the friction resistant polymer coating in the aforementioned manner have included liquid tin tetrachloride and ferric ion solutions such as ten grams ferric acetylacetonate dissolved in 100 milliliters methanol and twenty milliliters trichloroethylene as well as three hundred grams ferric chloride hydrate dissolved in 100 milliliters methyl alcohol and twenty milliliters hydrochloric acid. A still further preferred chemical pretreatment medium comprises five grams ferric acetylacetonate dissolved in ninety milliliters of methylene chloride. Representative conditions forming the polymer coating within the coating apparatus comprise exposing the preheated surface activated sample to a continuous nitrogen gas stream containing approximately one-five volume percent vaporized tricresyl phosphate and which may still further contain approximately one-five volume percent oxygen. A suitable coating apparatus in which the illustrated method can be carried out in such manner is further described in connection with the following preferred embodiments.

In a different representative method of producing a satisfactory friction polymer according to the present invention, the ceramic surface is chemically treated prior to vapor deposition thereon of the polymer coating by means of electrostatically spraying a liquid dispersion of the activating metal ions (such as employed in the preceding embodiment) on the bare ceramic surface after being preheated to a temperature of at least 300° C. While further processing of the ceramic article to produce the final polymer coating can thereafter proceed in the same manner as described for said preceding embodiment, it is expected that variations therefrom in the vapor deposition can produce comparable results. For example, a substitution of the other vaporizable polymer forming organic reactant previously mentioned should enable formation of the polymer coating under the same or similar reaction conditions. It can be further expected that routine variation in the procedure herein illustrated for chemical pretreatment of the ceramic surface to include preheating temperatures, solution concentration and any further conditioning time period can likewise influence the nature and extent of the polymer coating obtained with such substitution of organic polymer forming reactants in such reaction medium.

BRIEF DESCRIPTION OF THE DRAWINGS

FIG. 1 is a flow chart depicting a representative coating apparatus for vapor deposition of a solid organic polymer lubricating film according to the present invention.

DETAILED DESCRIPTION OF THE PREFERRED EMBODIMENTS

Figure 2B:
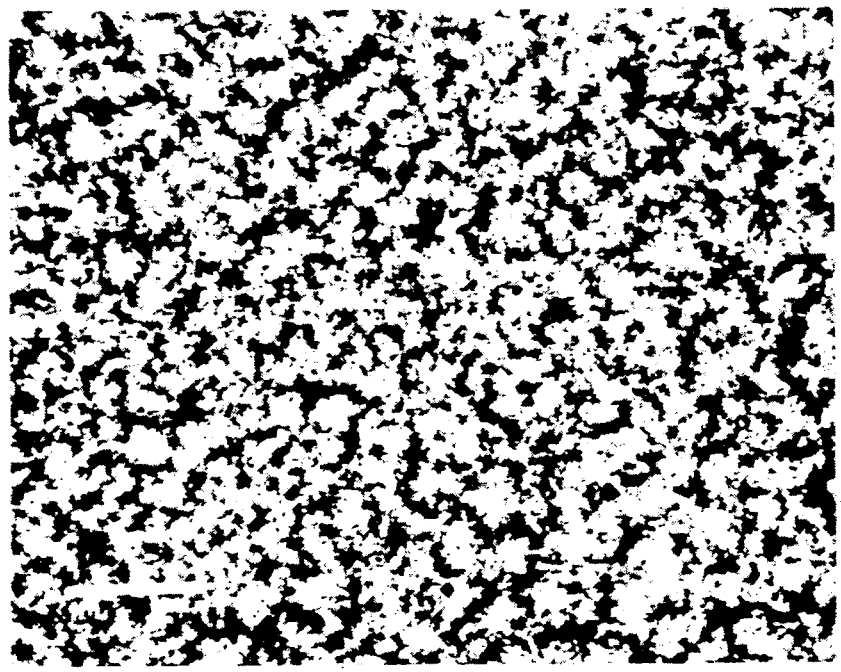
FIG. 2a and 2b are microphotographs depicting polymer lubricating film formation on hot pressed silicon carbide ceramic in the FIG. 1 coating apparatus.

Referring to the drawings, there is depicted in FIG. 1 a representative coating apparatus 10 which can be employed to form the organic polymer lubricating film according to the present invention on one or more surfaces of a stationary ceramic article such as a body of silicon nitride, silicon carbide or vitreous silica. Coating apparatus 10 includes a preheating chamber 12 and a vapor deposition chamber 14 which are physically spaced apart to enable a vent passageway 16 therebetween. Preheating chamber 12 is provided with conventional heating means (not shown) as well as conduit means 18 enabling a nitrogen gas stream 19 to be circulated therethrough at a typical rate of approximately two hundred cubic centimeters per minute. The nitrogen gas stream can be provided within a stainless steel tube member 20 as shown which further provides suitable containment means in which to house the ceramic articles while being preheated. To further illustrate such means, three quarter inch diameter stainless steel tubing can be used in which to process ceramic articles having physical dimensions of 0.25"×0.25"×0.125". As further shown in the drawing, a push rod member 22 is provided through an entrance opening of said tubing member in order to facilitate handling of the ceramic articles. Further chemical pretreatment of said ceramic articles as hereinbefore defined in order to provide one or more activated surfaces upon which the polymer film is subsequently formed is carried out with separate conventional apparatus means (not shown) immediately upon removing the heated ceramic articles from the preheating chamber. Following the hereinbefore specified chemical surface activation treatment, the ceramic articles are next transferred to the vapor deposition chamber 14 which is maintained at a temperature in the approximate range 300°-800° C. with conventional heating means (not shown). Vapor deposition chamber 14 includes an open-ended ceramic combustion tube 24 connected at one end to another stainless steel tube member 26 enabling passage of a suitable polymer forming organic reaction medium into the combustion tube. More particularly, stainless tube member 26 can have a T shaped construction packed with glass wool 28 for enhanced vapor mixing while further being heated with a conventional heating tape 30. A liquid medium 32 containing the polymer forming reactant such as liquid tricresyl phosphate is introduced into the tube member 26 at a controlled rate so as to become vaporized in a nitrogen carrier gas stream 34 also therein introduced. To still further illustrate typical conditions for vapor phase introduction of a suitable reaction medium into the vapor deposition chamber, the tricresyl phosphate reaction mixture herein being illustrated can employ from about one-five volume percent vaporized tricresyl phosphate in the heated nitrogen gas stream and with the introduction temperature of said gaseous reaction mixture being maintained at approximately 300° C.

Figure 2A:
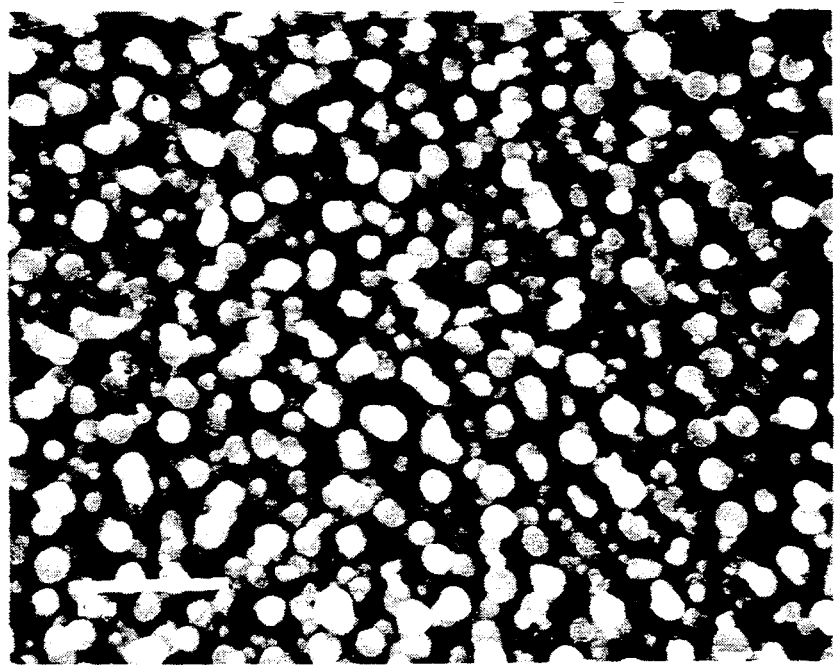

FIGS. 2a and 2b represent microphotographs obtained by conventional scanning electron microscope means at two thousand times magnification for different surfaces of hot pressed silicon carbide articles after coating in the FIG. 1 apparatus. The reaction conditions employed in the vapor deposition chamber of said apparatus to produce the respective polymer coatings consisted of exposing the ceramic surfaces to a nitrogen gas stream containing approximately 1.5 volume percent tricresyl phosphate for approximately three minutes at approximately 700° C. The polymer coating shown in FIG. 2a was formed after activating the ceramic surface with a ferric acetylacetonate chemical pretreatment as hereinabove defined and proved sufficiently adherent in protecting the underlying ceramic surface from mechanical abrasion at temperatures of at least 500° C. As distinct therefrom, the polymer coating depicted in FIG. 2b was formed without prior activation of the ceramic surface according to the present invention and was found to have such limited adherence to the ceramic surface that it could easily be blown off.

Figure 3:
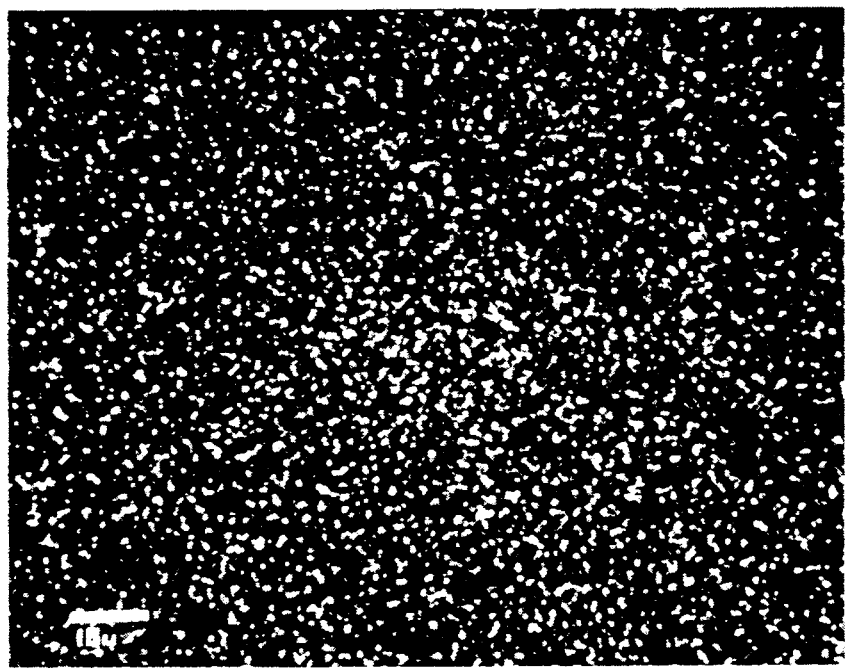
FIG. 3 is a microphotograph depicting polymer lubricating film formation on hot pressed silicon nitride ceramic in the FIG. 1 apparatus.

In FIG. 3 there is depicted another photomicrograph again obtained by conventional scanning electron microscope means but at a one thousand times magnification. This photograph depicts an adherent friction polymer coating deposited on a hot pressed silicon nitride ceramic after chemical activation of the ceramic surface according to the present invention. In accordance therewith, the previously disclosed chemical pretreatment with ferric acetylacetonate solution was employed to produce a brown-orange film on the uncoated ceramic surface and the polymer coating thereafter deposited on the treated surface at approximately 750° C. with a nitrogen gas stream containing approximately 1.5 volume percent tricresyl phosphate for an exposure period of approximately three minutes.

It will be apparent from the foregoing description that a broadly useful and novel means has been provided to protect various type ceramic articles from mechanical abrasion at elevated temperatures up to at least 500° C. It is contemplated that modifications can be made in the specific organic polymer coatings and methods for obtaining such coatings than herein illustrated, however, without departing from the spirit and scope of the present invention. For example, chemical pretreatment of the ceramic surface with activating metal ions other than iron and tin are contemplated as well as employment of vaporizable polymer forming organic reactants other than tricresyl phosphate, all as herein above further mentioned. Likewise, it is also contemplated that similar protective coatings can be applied to still other ceramic materials now being developed for high temperature dynamic product applications, such as various stabilized zirconia ceramics. Consequently, it is intended to limit the present invention only by the scope of the appended claims.

What we claim as new and desire to secure by Letters Patent of the United States is:

1. A high temperature dynamic use ceramic article coated preferentially with an adherent vapor deposited soild organic polymer lubricating film which resists mechanical wear of the ceramic article surface at elevated temperatures of at least 500° C., said lubricating film having been formed by chemically treating the uncoated ceramic surface at elevated temperatures with a transition metal element to form a deposit comprising activating metal ions of said transition metal element on the ceramic surface and exposing the treated ceramic surface to a vaporized polymer-forming organic reactant at elevated temperatures whereby said lubricating film is formed on the treated ceramic surface by reaction between the vaporized organic reactant and the activating metal ions, and with adherence of the lubricating film to the treated ceramic surface at the elevated temperatures being substantially limited to locations on the treated ceramic surface where the activating metal ions have been deposited.

2. The coated ceramic article of claim 1 wherein the activating metal ions form a film deposit on the treated surface.

3. The coated ceramic article of claim 1 wherein the activating metal ions are obtained from an iron compound.

4. The coated ceramic article of claim 1 wherein the activating metal ions are obtained from a tin compound.

5. The coated ceramic article of claim 1 wherein the lubricating film comprises an organophosphorous polymer.

6. The coated ceramic article of claim 1 wherein the the ceramic material is silicon carbide.

7. The coated ceramic article of claim 1 wherein the ceramic material is silicon nitride.

8. A high temperature dynamic use ceramic article having a wear-resistant coating which resists mechanical wear of the ceramic article surface at elevated temperatures of at least 500° C. and is formed by:
   (a) chemically treating the uncoated ceramic surface at elevated temperatures with activating metal ions of a transition metal element to form a deposit of the activating metal ions on the ceramic surface, and
   (b) exposing the treated ceramic surface to a vaporized polymer-forming organic reactant at elevated temperatures whereby an adherent solid organic polymer lubricating film is produced on the treated surface by reaction between the vaporized organic reactant and the activating metal ions, and with adherence of the lubricating film to the treated ceramic surface at the elevated temperatures being substantially limited to locations on the treated ceramic surface where the activating metal ions have been deposited.

9. The coated ceramic article of claim 8 wherein the ceramic is a vitreous metal oxide.

10. The coated ceramic article of claim 8 wherein the ceramic is silicon carbide.

11. The coated ceramic article of claim 8 wherein the ceramic is silicon nitride.

12. The coated ceramic article of claim 8 wherein the treated ceramic surface is further conditioned by exposure to atmospheric conditions before exposure to the vaporized reactant.

13. The coated ceramic article of claim 8 wherein exposure of the treated ceramic surface to the vaporized reactant at elevated temperatures is carried out under atmospheric conditions containing a minor concentration of oygen.

* * * * *